(12) United States Patent
Naka et al.

(10) Patent No.: US 10,490,704 B2
(45) Date of Patent: Nov. 26, 2019

(54) LIGHT EMITTING DEVICE AND METHOD OF PRODUCING THE SAME

(71) Applicant: NICHIA CORPORATION, Anan-shi, Tokushima (JP)

(72) Inventors: Ryoji Naka, Tokushima (JP); Naofumi Sumitani, Itano-gun (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 16/218,298

(22) Filed: Dec. 12, 2018

(65) Prior Publication Data

US 2019/0115504 A1  Apr. 18, 2019

Related U.S. Application Data

(63) Continuation of application No. 15/840,686, filed on Dec. 13, 2017, now Pat. No. 10,193,027.

(30) Foreign Application Priority Data

Dec. 16, 2016 (JP) ................................ 2016-244570

(51) Int. Cl.
*H01L 33/48* (2010.01)
*H01L 33/62* (2010.01)
*H01L 33/60* (2010.01)
*H01L 23/00* (2006.01)
(Continued)

(52) U.S. Cl.
CPC .......... *H01L 33/483* (2013.01); *H01L 33/486* (2013.01); *H01L 33/60* (2013.01);
(Continued)

(58) Field of Classification Search
CPC ....... H01L 33/483; H01L 33/62; H01L 33/60; H01L 2924/12041; H01L 2224/97; H01L 2933/0058
(Continued)

(56) References Cited

U.S. PATENT DOCUMENTS 9,755,123 B2 * 9/2017 Ukawa et al.
2006/0186425 A1 8/2006 Yano et al.
(Continued)

FOREIGN PATENT DOCUMENTS

JP 2005-136378 A 5/2005
JP 2005-310680 A 11/2005
(Continued)

OTHER PUBLICATIONS

Notice of Allowance on U.S. Appl. No. 15/840,686 dated Sep. 14, 2018.

*Primary Examiner* — Thinh T Nguyen
(74) *Attorney, Agent, or Firm* — Foley & Lardner LLP

(57) ABSTRACT

A light emitting device includes: a resin package including: a plurality of leads that includes: a first lead, and a second lead, a first resin portion, a second resin portion, and a third resin portion, the leads and the at least one inner lateral wall surface of the first resin portion defining a recess, the third resin portion being located between the first lead and the second lead, the second resin portion disposed surrounding an element mounting region at the bottom of the recess; and at least one light emitting element disposed on an element mounting region. At least one inner lateral wall surface of the recess has at least one protruding portion that protrudes toward the at least one light emitting element. A region of the recess between the at least one inner lateral wall surface and the second resin portion is covered by a light-reflective member.

7 Claims, 13 Drawing Sheets

(51) Int. Cl.
*H01L 25/16* (2006.01)
*H01L 29/866* (2006.01)

(52) U.S. Cl.
CPC .............. H01L 33/62 (2013.01); *H01L 24/48* (2013.01); *H01L 25/165* (2013.01); *H01L 25/167* (2013.01); *H01L 29/866* (2013.01); *H01L 2224/48091* (2013.01); *H01L 2224/48175* (2013.01); *H01L 2224/73265* (2013.01); *H01L 2224/97* (2013.01); *H01L 2924/12035* (2013.01); *H01L 2924/12041* (2013.01); *H01L 2924/19107* (2013.01); *H01L 2933/0033* (2013.01); *H01L 2933/0058* (2013.01)

(58) Field of Classification Search
USPC .................. 257/98, 99, 100; 438/22, 25, 26
See application file for complete search history.

(56) References Cited

U.S. PATENT DOCUMENTS

| | | |
|---|---|---|
| 2008/0054287 A1 | 3/2008 | Oshio et al. |
| 2014/0085884 A1 | 3/2014 | Horio et al. |
| 2016/0365494 A1* | 12/2016 | Ukawa et al. |

FOREIGN PATENT DOCUMENTS

| | | |
|---|---|---|
| JP | 2007-123484 A | 5/2007 |
| JP | 2008-060344 A | 3/2008 |
| JP | 2013-115116 A | 6/2013 |
| JP | 2013-131519 A | 7/2013 |
| JP | 2014-067846 A | 4/2014 |
| JP | 2014-158011 A | 8/2014 |

* cited by examiner

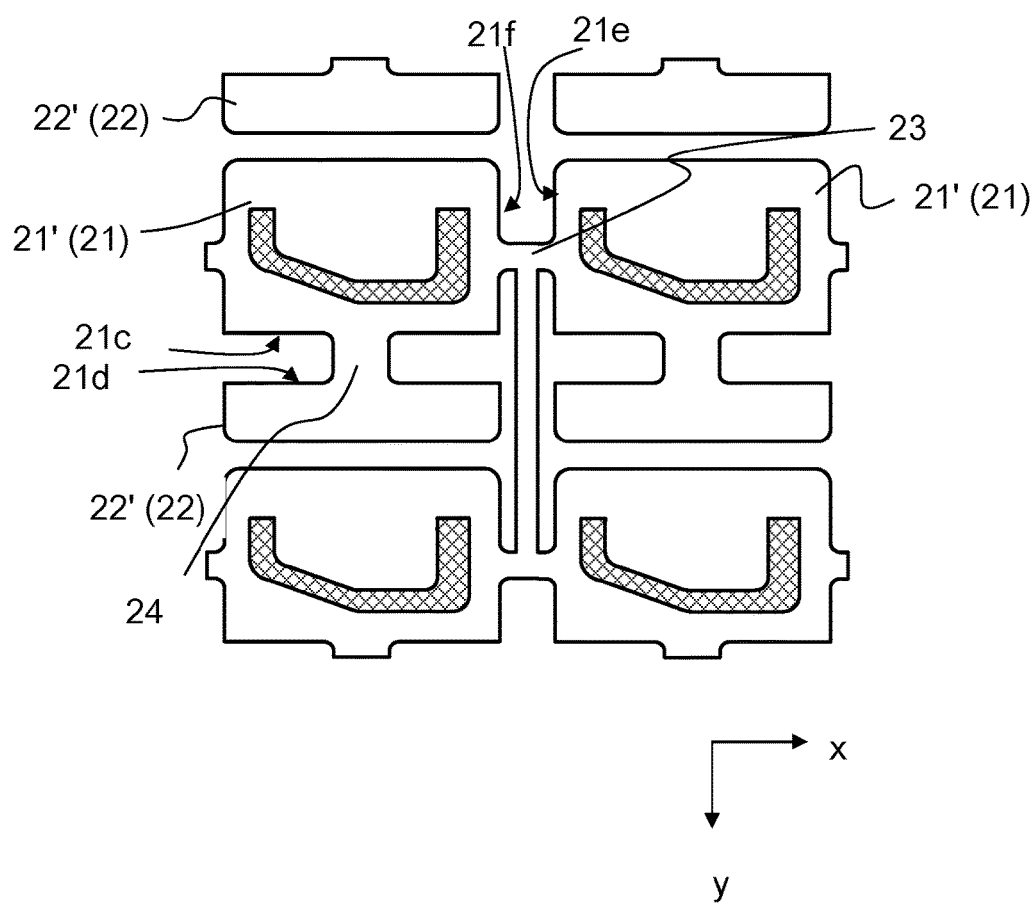

LIGHT EMITTING DEVICE AND METHOD OF PRODUCING THE SAME

CROSS-REFERENCE TO RELATED APPLICATIONS

This application claims priority to U.S. patent application Ser. No. 15/840,686, filed on Dec. 13, 2017, which claims priority to Japanese Patent Application No. 2016-244570, filed on Dec. 16, 2016, the disclosure of which is hereby incorporated by reference in its entirety.

BACKGROUND

The present disclosure relates to a light emitting device and a method of producing the same.

For example, a light emitting device described in Japanese Patent Publication No. 2008-60344 includes a resin package including a lead and a resin portion, a reflective layer disposed on an inner wall defining a recess of the resin package, and a light emitting element disposed at a bottom of the recess.

SUMMARY

In such a light emitting device, light extraction efficiency may be decreased if an amount of the reflective layer is not sufficient. Embodiments of the present disclosure provide a light emitting device that includes a reflective layer and has a high light extraction efficiency, and a method of producing such a light emitting device.

A light emitting device according to the present disclosure comprises a resin package and at least one light emitting element. The resin package includes a plurality of leads that include a first lead having an upper surface and a second lead having an upper surface, a first resin portion having at least one inner lateral wall surface, a second resin portion, and a third resin portion having an upper surface. The plurality of leads and the at least one inner lateral wall surface of the first resin portion defining a recess. The third resin portion being located between the first lead and the second lead. The upper surface of the first lead, the upper surface of the second lead and the upper surface of the third resin portion located at a bottom of the recess. The second resin portion disposed surrounding an element mounting region at the bottom of the recess. The at least one light emitting element disposed on the element mounting region at the bottom of the recess of the resin package. The at least one of the at least one inner lateral wall surface of the recess has at least one protruding portion, the protruding portion protruding toward the at least one light emitting element. A region of the recess surrounded by the at least one inner lateral wall surface and the second resin portion is covered by a light-reflective member.

The present disclosure provides a light emitting device having an improved light extraction efficiency.

BRIEF DESCRIPTION OF THE DRAWINGS

FIG. 5 is a schematic top view of a portion of a lead frame that corresponds to the four light emitting device regions 101'.

DETAILED DESCRIPTION

Figure 1A:
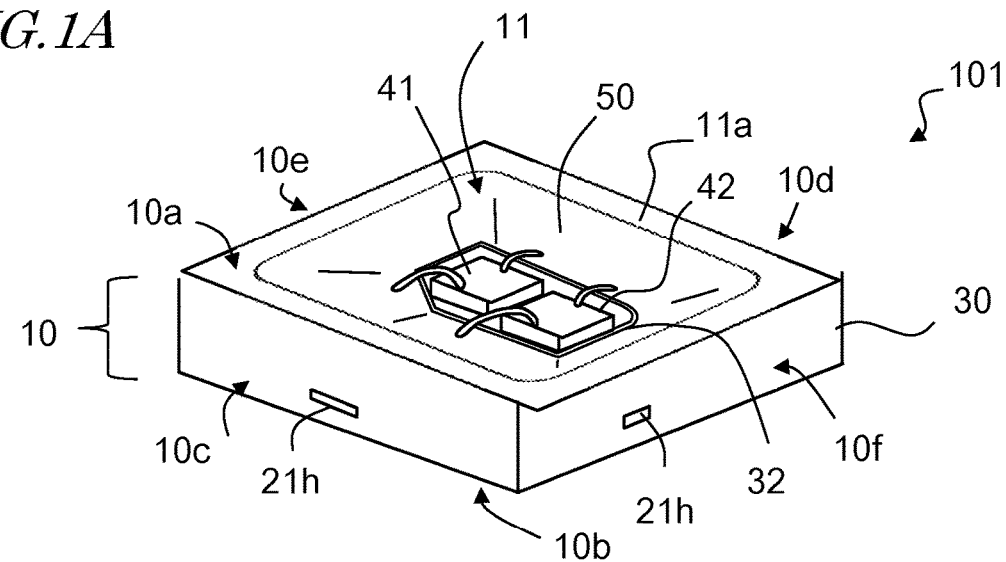
FIG. 1A is a schematic perspective view of a light emitting device according to one embodiment of the present disclosure, when viewed from above.

A light emitting device of the present disclosure will be described below in detail with reference to the drawings. The light emitting device of the present disclosure is not limited to the description below. In the description below, terms indicating a specific direction or position (e.g., "above", "below", or another term including such a term) will be used. Such terms will be merely used for easier understanding of the relative directions and positions in drawings referred to. The size, the positional relationship or the like of components in the drawings may be exaggerated for easier understanding and may not reflect the sizes, or the relative sizes between the components, in the light emitting device.

Light Emitting Device 101

Figure 1B:
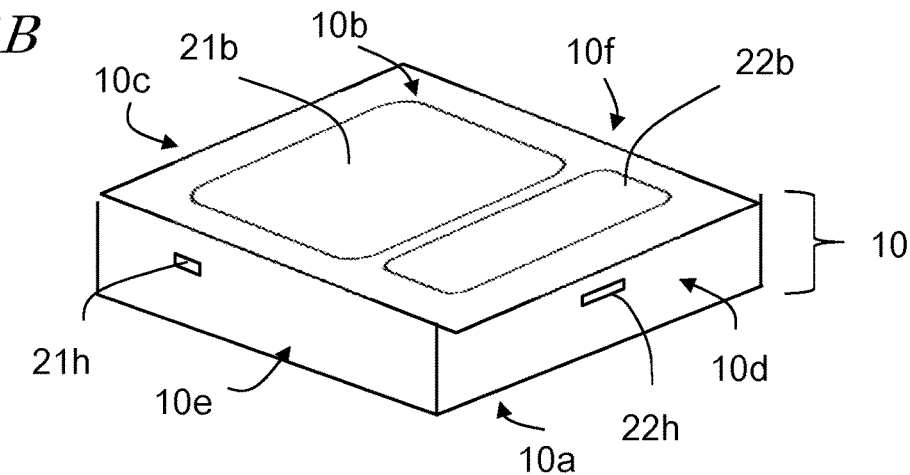
FIG. 1B is a schematic perspective view of the light emitting device according to one embodiment of the present disclosure, when viewed from below.
Figure 1C:
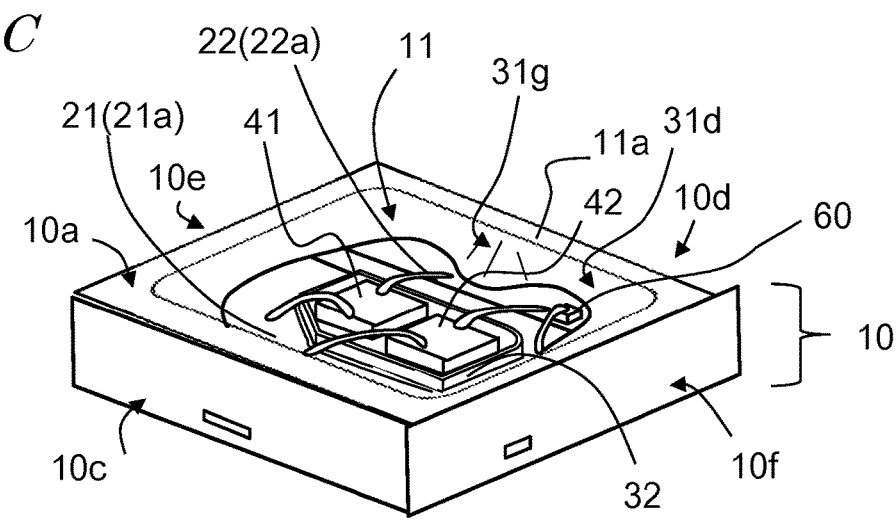
FIG. 1C is a schematic perspective view of a structure of the light emitting device according to one embodiment of the present disclosure, when viewed from above, in a state where a light-reflective member is removed.

FIG. 1A and FIG. 1B are schematic perspective views of a light emitting device 101 when viewed from above and below the light emitting device 101, respectively. FIG. 1C is a schematic perspective view of a structure of the light emitting device 101, when viewed from above the light emitting device 101, in a state where a light-reflective member 50 is removed.

Figure 2A:
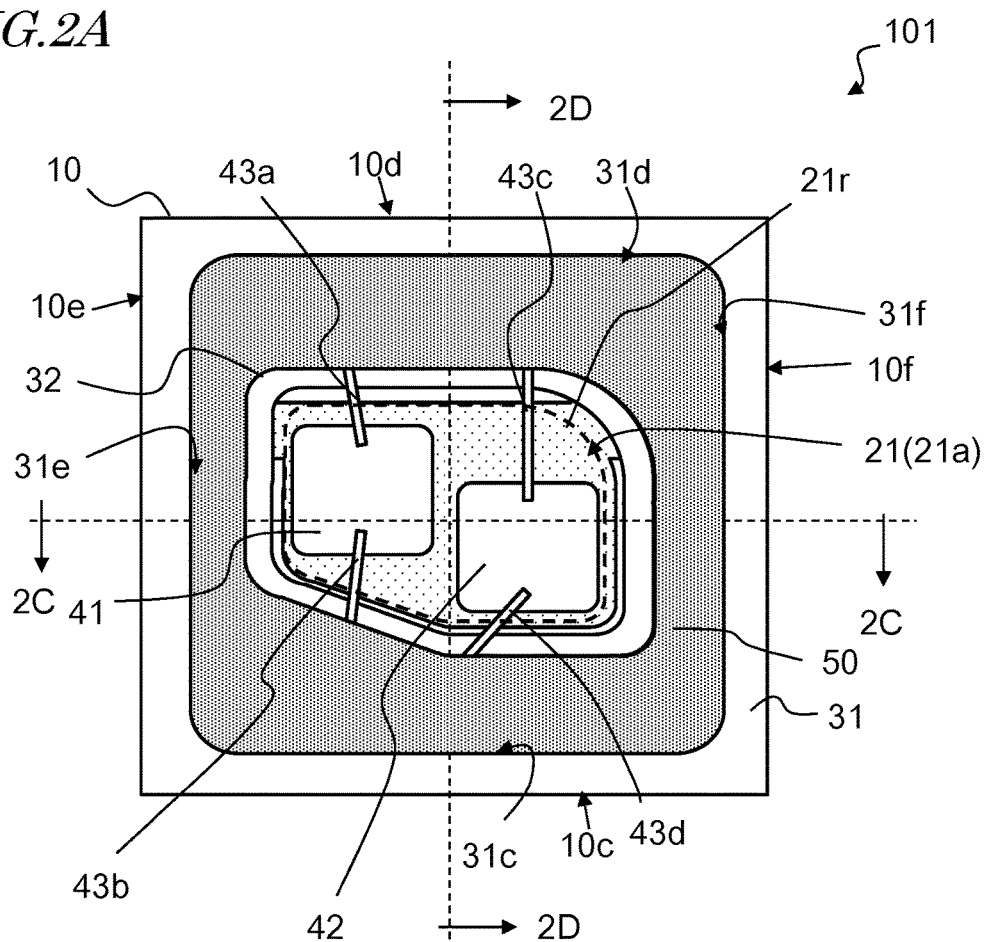
FIG. 2A is a schematic top view of the light emitting device according to an embodiment of the present disclosure.
Figure 2B:
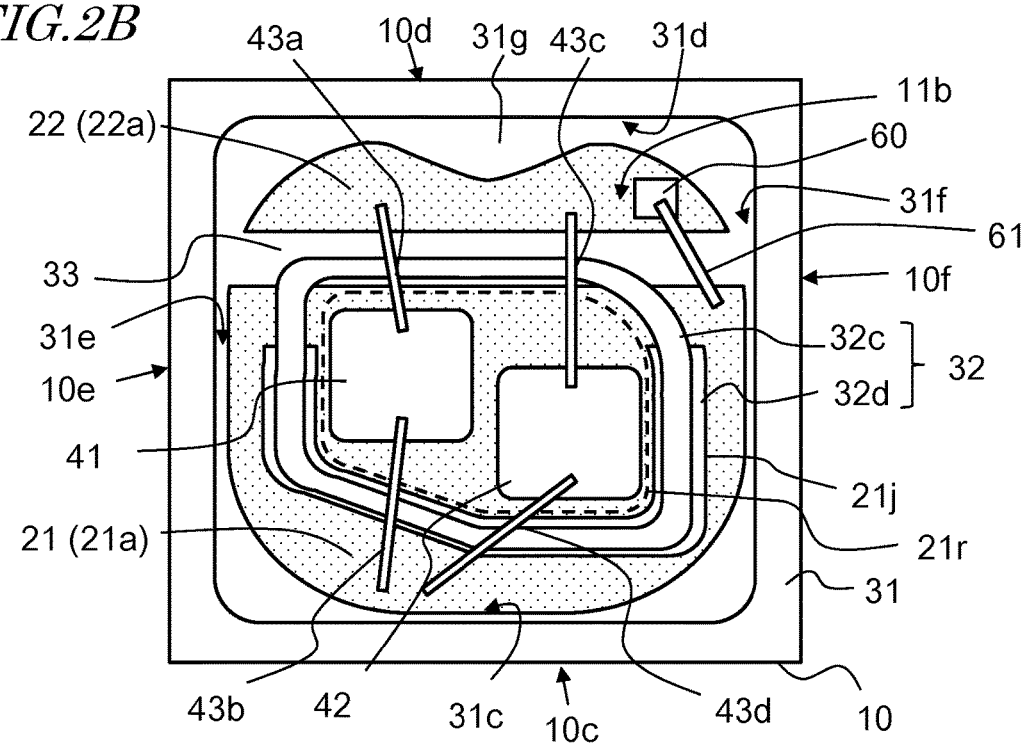
FIG. 2B is a schematic top view of a structure of the light emitting device according to one embodiment of the present disclosure, in a state where the light-reflective member is removed.
Figure 2C:
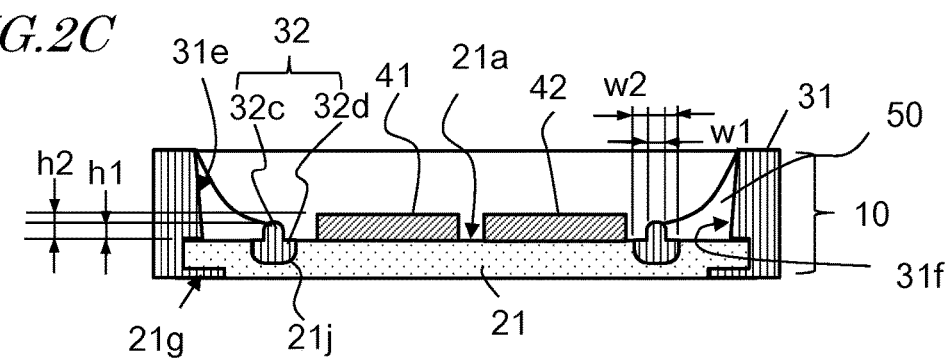
FIG. 2C is a schematic cross-sectional view of the light emitting device taken along a line 2C-2C in FIG. 2A.
Figure 2D:
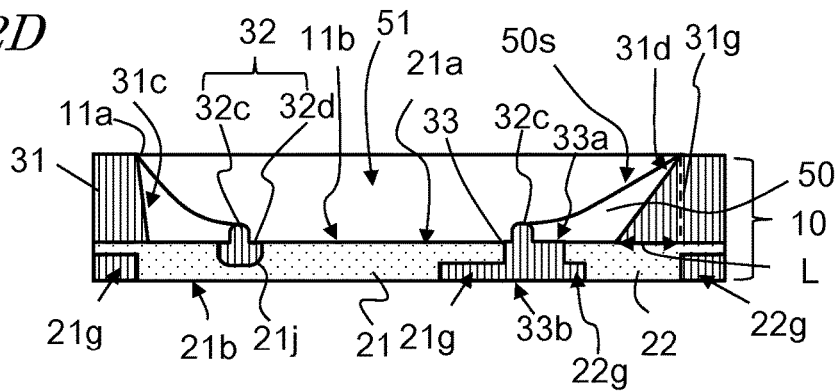
FIG. 2D is a schematic cross-sectional view of the light emitting device taken along a line 2D-2D in FIG. 2A.

FIG. 2A is a schematic top view of the light emitting device 101. FIG. 2B is a schematic top view of the light emitting device 101 in a state where the light-reflective member 50 is removed. FIG. 2C and FIG. 2D are schematic cross-sectional views of the light emitting device 101 taken along line 2C-2C and line 2D-2D, respectively, in FIG. 2A.

The light emitting device 101 includes a resin package 10, at least one light emitting element, and a light-reflective member 50. In the present embodiment, the light emitting device 101 includes light emitting elements 41 and 42. Each of the components of the light emitting device 101 will be described below in detail.

Resin Package 10

The resin package 10 is a housing and defines a recess 11. In the recess 11, the light emitting elements 41 and 42 and the light-reflective member 50 are disposed. The resin package 10 includes a resin body 30, a first lead 21 and a second lead 22. The resin body 30 is formed integrally with the first lead 21 and the second lead 22. The first lead 21 has an upper surface 21a and a lower surface 21b opposite to the upper surface 21a. The second lead 22 has an upper surface 22a and a lower surface 22b opposite to the upper surface 22a. The first lead 21 and the second lead 22 are arranged such that the lower surface 21b and the lower surface 22b are in substantially the same plane. A third resin portion 33 (described below) of the resin body 30 is disposed between the first lead 21 and the second lead 22.

The resin package 10 has an upper surface 10a and a lower surface 10b opposite to the upper surface 10a. In the present embodiment, the resin package 10 has a substantially quadrangular external shape in a top view. Therefore, the resin package 10 has four outer lateral surfaces, that is, an outer lateral surface 10c, an outer lateral surface 10d opposite to the outer lateral surface 10c, an outer lateral surface 10e and an outer lateral surface 10f opposite to the outer lateral surface 10e. The shape of the resin package 10 in a top view is not limited to be a substantially quadrangular external shape, and may be any another appropriate shape. In a top view, one corner of an opening 11a of the resin package 10 may be rounded to serve as an anode mark or a cathode mark. The anode mark or the cathode mark serves as a mark indicating the polarity of the two leads 21 and 22.

The resin package 10 defines the recess 11 having the opening 11a in the upper surface 10a. At a bottom 11b of the recess 11, a portion of the upper surface 21a of the first lead 21 and a portion of the upper surface 22a of the second lead 22 are located. The shape of the recess 11 will be described in detail below in the description regarding the resin body 30.

At the bottom surface 10b of the resin package 10, a portion of the lower surface 21b of the first lead 21 and a portion of the lower surface 22b of the second lead 22 are exposed.

First Lead 21, Second Lead 22

The first lead 21 and the second lead 22 are electrically conductive, and serves as electrodes for supplying electric power to the light emitting elements 41 and 42, respectively. In the present embodiment, two leads, that is, the first lead 21 and the second lead 22, are disposed.

The light emitting device 101 may include a third lead (third metal portion) in addition to the first lead 21 and the second lead 22. The third lead (third metal portion) may serve as an electrode or as a heat dissipating member having a high heat conductivity.

Figure 3A:
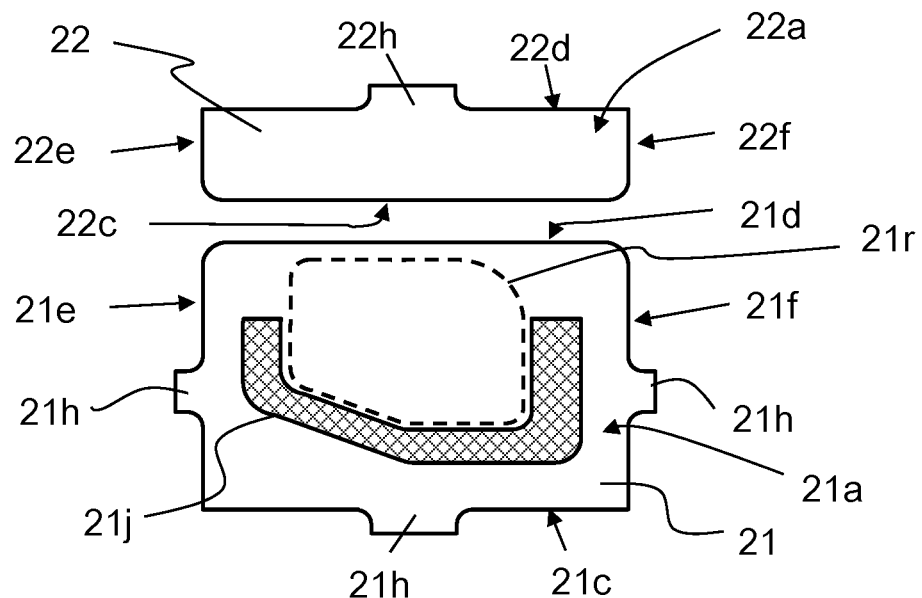
FIG. 3A is a schematic top view of a first lead and a second lead.
Figure 3B:
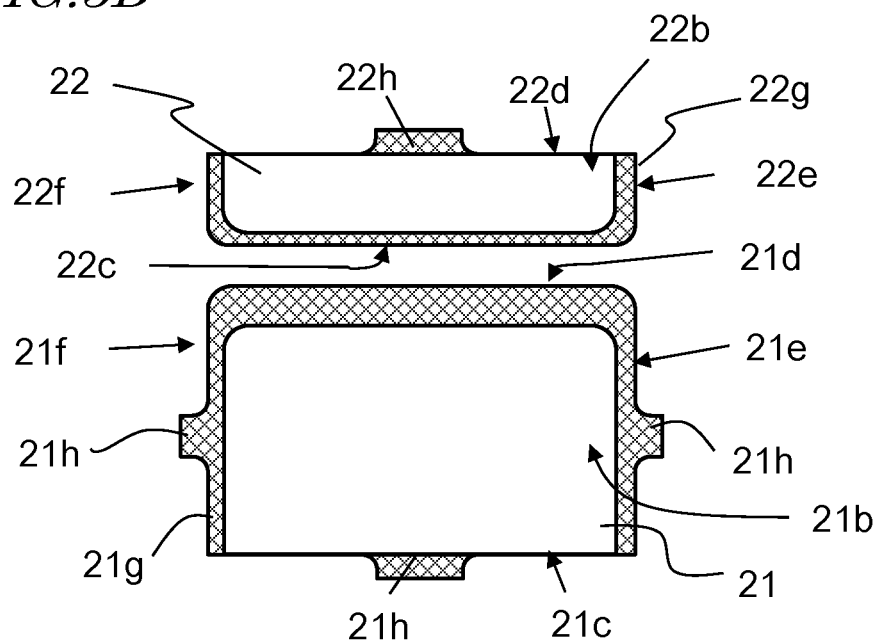
FIG. 3B is a schematic bottom view of the first lead and the second lead.

FIG. 3A is a schematic top view of the first lead 21 and the second lead 22, and FIG. 3B is a schematic bottom view of the first lead 21 and the second lead 22. The first lead 21 has lateral portions 21c, 21d, 21e and 21f. The first lead 21 has a lateral peripheral groove 21g (indicated by the hatching) in the lower surface 21b along the lateral portions 21d, 21e and 21f. The lateral peripheral groove 21g may be formed by an etching technique, a pressing technique or the like. In a top view, the first lead 21 includes extending portions 21h each disposed at the center or its vicinity of a respective one of the lateral portions 21c, 21e and 21f. Each of the extending portions 21h is a portion of the first lead 21. As shown in FIG. 1A and FIG. 1B, an end surface of each of the extending portions 21h at a respective one of the lateral portions 21c, 21e and 21f is exposed from a respective one of the outer lateral surfaces 10c, 10e and 10f of the resin package 10. The extending portions 21h extend from a main body portion of the first lead 21 toward the outer lateral surfaces 10c, 10e and 10f of the resin package 10. Referring to FIG. 3A and FIG. 3B, the "main body portion" refers to a portion of the first lead 21 excluding the extending portions 21h and having a substantially quadrangular external shape in a top view.

It is preferable that the upper surface 21a of the first lead 21 defines a groove 21j. The groove 21j is disposed along at least a portion of an outer perimeter of an element mounting region 21r (indicated by the dashed line in FIG. 3A) of the upper surface 21a. The element mounting region 21r refers to a region of the first lead 21 on which the light emitting elements 41 and 42 are to be mounted. The expression that "the groove 21j is disposed along at least a portion of the outer perimeter of the element mounting region 21r" encompasses a case where the groove 21j is disposed along an entirety of the outer perimeter of the element mounting region 21r, and a case where the groove 21j is disposed along a portion of the outer perimeter of the element mounting region 21r. The groove 21j is filled with a portion of a second resin portion 32 (described below) of the resin body 30.

It is preferable that the groove 21j is disposed not to overlap the lateral peripheral groove 21g disposed along the lateral portion 21d in a top view. If the groove 21j disposed in the upper surface 21a and the lateral peripheral groove 21g disposed in the lower surface 21b overlap each other, a thickness of a corresponding portion of the first lead 21 is reduced from the upper surface 21a and the lower surface 21b, and thus may not have a sufficiently high strength. In view of this, with the groove 21j formed in the upper surface 21a not being disposed to overlap the lateral peripheral groove 21g disposed along the lateral portion 21d in a top view, the first lead 21 can have a sufficiently high strength.

Similarly, the second lead 22 has lateral portions 22c, 22d, 22e and 22f. The second lead 22 has a lateral peripheral groove 22g (indicated by the hatching) in the lower surface 22b along the lateral portions 22c, 22e and 22f. In a top view, the second lead 22 includes an extending portion 22h at the center or its vicinity of the lateral portion 22d. The extending portion 22h is a portion of the second lead 22. An end surface of the extending portion 22h at the lateral portion 22d is exposed from the outer lateral surface 10d of the resin package 10. The extending portion 22h extends from a main body part of the second lead 22 toward the outer lateral surface 10d of the resin package 10. Referring to FIG. 3A and FIG. 3B, the "main body part" refers to a portion of the second lead 22 excluding the extending portion 22h and having a substantially quadrangular external shape in a top view.

In the resin package 10, the first lead 21 and the second lead 22 are disposed apart from each other at a predetermined distance. The lateral portion 21d of the first lead 21 faces the lateral portion 22c of the second lead 22.

In this embodiment, the first lead 21 has an area size larger than that of the second lead 22 in a top view. This is because the first lead 21 includes the element mounting region 21r. In the case where the second lead 22 has the element mounting region 21r, the area size of the second lead 22 may be larger than the area size of the first lead 21 in a top view. Alternatively, the element mounting region 21r may be disposed over the first lead 21 and the second lead 22. In this case, the first lead 21 and the second lead 22 may have substantially the same area size in a top view.

The lateral peripheral grooves 21g and 22g are formed in the first lead 21 and the second lead 22 to improve the adhesiveness between the resin body 30 and the first lead 21 and between the resin body 30 and the second lead 22.

A lead frame (described below) includes portions to be the first lead 21 and the second lead 22 (in the description below, such portions will be referred to simply as the first lead 21 and the second lead 22). Each of the extending portions 21h and 22h is a portion of a respective one of connecting portions 23 and 24, each of which connects a main body portion of a respective one of the first leads 21 and a main body portion of a respective one of the second leads 22 to a frame portion of the lead frame. The lead frame includes the frame portion, the plurality of connecting portions 23 and 24, the main body portions of a plurality of the first leads 21, and the main body portions of a plurality of the second leads 22. Each of the plurality of connecting portions 23 connects the main body portions of adjacent ones of the first leads 21, and each of the plurality of connecting portions 24 connecting the main body portion of a respective one of the first leads 21 and the main body portion of a respective one of the second leads 22. The resin body 30 is formed integrally with the lead frame, and then is cut at the coupling portions to be singulated. Therefore, the extending portions 21h and 22h, each of which was a portion of a respective one of the coupling portions, are respectively exposed from corresponding ones of the outer lateral surfaces 10c, 10d, 10e and 10f of the resin package 10 to be in substantially the same plane as the resin body 30. After the lead frame is singulated, the first lead 21 including the main body part and the extending portions 21h is obtained, and the second lead 22 including the main body part and the extending portion 22h is obtained.

Each of the first lead 21 and the second lead 22 includes a substrate and a metal layer covering the substrate. The substrate is preferably a plate-like member. The substrate contains a metal material such as copper, aluminum, gold, silver, iron, nickel, an alloy of two or more of these, a phosphor bronze, iron-containing copper, or the like. The substrate may be of a single layer or have a multilayer structure (for example, a clad material). In particular, for the substrate, copper, which is less expensive and has a high heat-dissipating property, can be preferably used. The metal layer contains, for example, silver, aluminum, nickel, palladium, rhodium, gold, copper, an alloy of two or more of these, or the like. Each of the first lead 21 and the second head 22 may include a region with no metal layer. In the first lead 21 and the second lead 22, the upper surfaces 21a and 22a and the lower surfaces 21b and 22b may be made of different metal materials. For example, the metal layer with a multilayer structure containing a nickel layer may be disposed at the upper surfaces 21a and 22a side, and the metal layer with a multilayer structure not containing a nickel layer may be disposed at the lower surfaces 21b and 22b side.

In the case where, for the metal layer, a silver-plated or silver alloy-plated layer is disposed at an outermost surface side of each of the first lead 21 and the second lead 22, it is preferable to dispose a protective layer of silicon oxide or the like on the silver-plated or silver alloy-plated layer. With this arrangement, the silver-plated or silver alloy-plated layer can be inhibited from being discolored by a sulfur component or the like in the air. The protective layer may be formed by using a vacuum process such as, for example, sputtering or the like, but may be formed by any other appropriate known method. The protective layer may be formed after the light emitting elements 41 and 42 are mounted and connected via a wire and before the light-reflective member 50 is formed, or may be partially formed after the light-reflective member 50 is formed.

Resin Body 30

Returning to FIG. 2B, the resin body 30 will be described. The resin body 30 is formed integrally with the first lead 21 and the second lead 22, and is included in the resin package 10 together with the first lead 21 and the second lead 22. The resin body 30 includes a first resin portion 31, the second resin portion 32 and the third resin portion 33.

The first resin portion 31 has four inner lateral surfaces, that is, inner lateral wall surfaces 31c, 31d, 31e and 31f, which define the recess 11 together with the first lead 21 and the second lead 22. The inner lateral wall surface 31c and the inner lateral wall surface 31d face each other, and the inner lateral wall surface 31e and the inner lateral wall surface 31f face each other.

The first resin portion 31 also has the outer lateral surfaces 10c, 10d, 10e and 10f of the resin package 10. The outer lateral surfaces 10c, 10d, 10e and 10f are opposite to the inner lateral wall surfaces 31c, 31d, 31e and 31f, respectively.

As shown in FIG. 2B, of the inner lateral wall surfaces 31c, 31d, 31e and 31f, two adjacent inner lateral wall surfaces are connected with each other to form a curved surface, and there is no clear border between such two adjacent inner lateral wall surfaces. The opening 11a of the recess 11 has an approximately quadrangular shape in which the four corners are rounded. The bottom 11b of the recess 11 has an approximately quadrangular shape, and four corners of an outer perimeter thereof are rounded to form an arc shape having a radius greater than that of the four corners of the outer perimeter of the opening 11a.

The second resin portion 32 is located at the bottom 11b of the recess 11, and is disposed surrounding the element mounting region 21r. The second resin portion 32 demarcates a region of the light-reflective member 50, and inhibits the light-reflective member 50 from directly covering lateral surfaces of each of the light emitting elements 41 and 42. With the light-reflective member 50 that does not directly cover the lateral surfaces of each the light emitting elements 41 and 42, light emitted to a lateral side of each of the light emitting elements 41 and 42 is inhibited from being confined at an inner side of the light-reflective member 50. As shown in FIG. 2C, the second resin portion 32 includes a second portion 32d disposed in the groove 21j, which is formed in the upper surface 21a, at a position below a plane including the upper surface 21a, and a first portion 32c disposed on the second portion 32d at a position above the plane including the upper surface 21a. In the present embodiment, the first portion 32c of the second resin portion 32 has a height h1 from the upper surface 21a of the first lead 21 and width w1, and has a ring shape to continuously surround the element mounting region 21r.

As shown in FIG. 2B, a part of the first portion 32c is on the upper surface 21a, another part of the first portion 32c is on the second portion 32d in the groove 21j, and the remaining part of the first portion 32c is on an upper surface 33a of the third resin portion 33 described below. It is preferable that width w2 of the groove 21j is greater than width w1 of the first portion 32c. The increase in width w2 of the groove 21j allows the contact area size between the second resin portion 32 and the first lead 21 to be increased, and reduction in width w1 of the first portion 32c allows for sufficiently securing a path for flowing the light-reflective member 50 at the time of disposing the light-reflective member 50 (described below). Namely, the second resin portion 32 on the upper surface 21a can be inhibited from being detached from the first lead 21, and the light-reflective member 50 can be disposed efficiently. Further, reduction in width w1 of the first portion 32c allows for facilitating a light-reflective surface (inclined surface 50s) of the light-reflective member 50 to be inclined. As a result, light emitted from the light emitting elements 41 and 42 is extracted upward efficiently.

It is preferable that height h1 of the first portion 32c from the upper surface 21c is smaller than height h2 of each of the light emitting elements 41 and 42 from the upper surface 21c. This allows light emitted from the light emitting elements 41 and 42 to be easily incident on the inclined surface 50s of the light-reflective member 50, and thus allows light to be emitted outside from the opening 11a efficiently.

The third resin portion 33 is a portion of the resin body 30 between the first lead 21 and the second lead 22. The third resin portion 33 has the upper surface 33a and a lower surface 33b. The upper surface 33a is at the bottom 11b of the recess 11. The lower surface 33b is at the lower surface 10b of the resin package 10. The third resin portion 33 is connected with a wall portion of the first resin portion 31 having the inner lateral wall surface 31e and a wall portion of the first resin portion 31 having the inner lateral wall surface 31f. In the case where, for example, the light emitting device 101 includes a third lead (i.e., third metal portion), the third resin portion 33 is located between the first lead 21 and the third lead (i.e., third metal portion) and between the second lead 22 and the third lead (i.e., third metal portion).

On the upper surface 33a of the third resin portion 33, a part of the first portion 32c of the second resin portion 32 is located as described above. With such a positional relationship between the second resin portion 32 and the third resin portion 33, when an uncured resin material to be formed into the resin body 30 by a molding method flows into a die, the resin material is introduced to a space in which the third resin portion 33 is to be formed and then to a space in which the second resin portion 32 is to be formed.

As shown in FIG. 1C and FIG. 2B, the first resin portion 31 of the resin package 10 has at least one protruding portion 31g in at least one of the inner lateral wall surfaces 31c, 31d, 31e and 31f. In this embodiment, the first resin portion 31 has one protruding portion 31g in the inner lateral wall surface 31d. The protruding portion 31g is located, for example, at a center or in the vicinity of the center of the inner lateral wall surface 31d. The protruding portion 31g protrudes from the inner lateral wall surface 31d toward the light emitting elements 41 and 42. As shown in FIG. 2D, in the present embodiment, protruding length L of the protruding portion 31g toward the light emitting elements 41 and 42 is larger at the bottom 11b of the recess 11 and smaller at the opening 11a of the recess 11. More specifically, at the opening 11a, the protruding portion 31g does not protrude toward a center of the opening 11a. With the protruding portion 31g being disposed at a part of the inner lateral wall surfaces of the resin package 10, an area of a region of the bottom 11b of the recess 11 on which the light-reflective member 50 is to be formed is decreased. Accordingly, during forming the light-reflective member 50, the bottom 11b of the recess 11 can be inhibited from including a region where the light-reflective member 50 is not formed. In particular, in a top view, the protruding portion 31g is formed in an inner lateral wall surface near a region of the bottom 11b except for the region where a resin material to be the light-reflective member 50 is to be applied (deposited). This allows for inhibiting the resin material from being insufficiently filled even in the region where the resin material cannot easily flow naturally.

As described below, at the time of disposing the light-reflective member 50 in the recess 11 of the resin package 10, the protruding portion 31g allows for inhibiting generation of a region not sufficiently filled with the uncured resin material for the light-reflective member 50. Therefore, it is preferable that the protruding portion 31g is provided in at least one of the inner lateral wall surface 31c, 31d, 31e or 31f at a portion at a great distance from the second resin portion 32. This is because such a region is likely to be insufficiently filled with the uncured resin material for the light-reflective member 50. In the present embodiment, the light emitting elements 41 and 42 are disposed on the upper surface 21a of the first lead 21, and the second resin portion 32 is disposed surrounding an entirety periphery of the element mounting region 21r, on which the light emitting elements 41 and 42 are disposed. Therefore, the distance between the inner lateral wall surface 31d on the second lead 22, on which the light emitting elements 41 and 42 are not disposed, and the second resin portion 32 is increased. Accordingly, the uncured resin material for the light-reflective member 50 is likely to be insufficiently charged on the second lead 22 at the bottom 22b. In view of this, with the protruding portion 31g located on the second lead 22, the material for the light-reflective member 50 can be inhibited from being insufficiently charged, and thus presence of a region lacking in the light-reflective member 50 can be inhibited.

The protruding portion 31g does not refer to a small protrusion of the inner lateral wall surface 31c, 31d, 31e or 31f such as microscopic irregularities measurable as surface roughness.

For a resin material to serve as a base material of the resin body 30, a thermosetting resin, a thermoplastic resin or the like may be used. Specific examples of the such a resin material include: curable materials, such as an epoxy resin composition, a silicone resin composition, a modified epoxy resin composition such as a silicon-modified epoxy resin, a modified silicone resin composition such as an epoxy-modified silicone resin, an unsaturated polyester resin, a saturated polyester resin, a polyimide resin composition, a modified polyimide resin composition, and the like; polyphthalamide (PPA); a polycarbonate resin; polyphenylenesulfide (PPS); a liquid crystal polymer (LCP); an ABS resin; a phenol resin; an acrylic resin; and a PBT resin. In particular, a thermosetting resin such as an epoxy resin composition or a modified silicone resin composition can be preferably used. As described above, the first resin portion 31, the second resin portion 32 and the third resin portion 33 are integrally connected with each other, and therefore may be made of the same resin material. The first resin portion 31, the second resin portion 32 and the third resin portion 33 may be made of different resin materials. For example, the first resin portion 31 and the third resin portion 33 made of the same resin material may be molded integrally with the first lead 21 and the second lead 22, and then the second resin portion 32 may be disposed by potting or the like. The resin body 30 has a viscosity that is preferably in a range of 10 pa·s to 40 pa·s, and more preferably, 15 pa·s to 25 pa·s, in an uncured state. With such a viscosity, the first resin portion 31, the second resin portion 32 and the third resin portion 33 may be formed to have a good fluidity even by a molding method using a die.

For the resin body 30, a material having a low light reflectance with respect to external light for the light emitting device 101 (typically, sunlight) may be used in order to improve the contrast of the light emitting device 101. In this case, it is generally preferable that the resin body 30 is black or of a color close thereto. Examples of the filler used for such a resin body 30 include: carbon such as acetylene black, active carbon, or graphite; a transfer metal oxide such as iron oxide, manganese dioxide, cobalt oxide, or molybdenum oxide; and a colored organic pigment. Such fillers may be used in accordance of a purpose.

Light Emitting Elements 41 and 42

For each of the light emitting element 41 and 42, a semiconductor light emitting element such as a light emitting diode can be used. In the present embodiment, the light emitting device 101 includes two light emitting elements. Alternatively, the light emitting device 101 may include one light emitting element, or three or more light emitting elements. Each of the light emitting elements 41 and 42 preferably contains a nitride semiconductor that can emit light in an ultraviolet range to a visible range ($In_xAl_yGa_{1-x-y}N$, $0 \leq x$, $0 \leq y$, $x+y \leq 1$). For example, the light emitting elements 41 and 42 may be configured to emit blue light and green light, respectively. In the case where the light emitting device 101 includes three light emitting elements, the three light emitting elements may be configured to emit blue light, green light and red light, respectively.

The light emitting elements 41 and 42 are disposed on the element mounting region 21r of the first lead 21, and are joined with the first lead 21 by a joining member. The material of the joining member may be, for example, a resin containing a resin material for the resin body 30 as described above; a solder such as a tin-bismuth based solder, a tin-copper based solder, a tin-silver based solder, a gold-tin based solder; a conductive paste or bump of silver, gold, palladium or the like; or a brazing material such as an anisotropic conductive material or a low melting point metal material. In the present embodiment, each of the light emitting elements 41 and 42 is electrically connected with the first lead 21 and the second lead 22 by respective ones of wires 43a, 43b, 43c and 43d. In the present embodiment, the light emitting elements 41 and 42 are connected in parallel between the first lead 21 and the second lead 22. Alternatively, the light emitting elements 41 and 42 may be connected in series.

Light-Reflective Member 50

The light-reflective member 50 reflects light emitted from the light emitting elements 41 and 42 toward the opening 11a. The light-reflective member 50 is disposed in a region surrounded by (i.e., disposed between) the inner lateral wall surfaces 31c, 31d, 31e and 31f of the recess 11 and the second resin portion 32. More specifically, the light-reflective member 50 covers the inner lateral wall surfaces 31c, 31d, 31e and 31f, a part of the upper surface 21a that is at an outer side of the second resin portion 32, the upper surface 22a of the second leas 22, and a part of the third resin portion 33. The light-reflective member 50 is not disposed at an inner side of the second resin portion 32, that is, on the element mounting region 21r.

The light-reflective member 50 has the inclined surface 50s between the inner lateral wall surfaces 31c, 31d, 31e and 31f and the second resin portion 32. The inclined surface 50s is recessed toward the bottom 11b of the recess 11. The light-reflective member 50 having the inclined surface 50s of such a shape reflects the light emitted from the light emitting elements 41 and 42 toward the opening 11a, and thus allows for improving the light output efficiency of the light emitting device 101.

An angle defined by a straight line connecting a top end and a bottom end of the inclining surface 50s of the light-reflective member 50, and the bottom 11b of the recess 11, may be smaller than an angle defined by a straight line connecting a top end and a bottom end of each of the inner lateral wall surfaces 31c, 32d, 32e and 32f of the resin package 10, and the bottom 11b of the recess 11. This is because the light-reflective member 50 may be formed to the vicinity of the light emitting elements 41 and 42. The light-reflective member 50 with such a structure allows light emitted from the light emitting elements 41 and 42 to be reflected toward the opening 11a efficiently.

The light-reflective member 50 is preferably made of a material that does not easily transmit or absorb light from the light emitting elements 41 and 42 or an external light. It is preferable that the light-reflective member 50 is white. For example, a resin for a base material of the light-reflective member 50 may be a thermosetting resin, a thermoplastic resin or the like. More specifically, a phenol resin, an epoxy resin, a BT resin, PPA, a silicone resin, or the like may be used for a base material of the light-reflective member 50. In such a resin to be the base material, light scattering particles of a light-reflective material that does not easily absorb the light from the light emitting elements 41 and 42 and has a refractive index greatly different from that of the base material (e.g., titanium oxide, zinc oxide, silicon oxide, zirconium oxide, aluminum oxide, aluminum nitride, etc.) may be dispersed, which allows for reflecting light efficiently. It is preferable that the material of the light-reflective member 50 in an uncured state has a viscosity lower than that of the material of the resin body 30 in an uncured state. For example, the viscosity of the material of the light-reflective member 50 in an uncured state is preferably in a range of 1 pa·s to 20 pa·s, and more preferably 5 pa·s to 15 pa·s. With such a viscosity, a material of the light-reflective member 50 wet-spreads sufficiently in the recess 11, and the light-reflective member 50 can be inhibited from being insufficiently filled. In general, if a resin contains a great amount of filler particles such as light scattering particles or the like, the entire viscosity of the resin is increased. However, in the light emitting device 101 according to the present disclosure, at least one of the inner lateral wall surfaces 31c, 32d, 31e or 31f includes the protruding portion 31g.

Therefore, even if the light-reflective member 50 has a high viscosity, insufficient filling with the light-reflective member 50 can be inhibited. It is preferable that the light-reflective member 50 in an uncured state has a high thixotropy.

It is preferable that the light-reflective member 50 has a light reflectance higher than that of the resin body 30. For example, the amount of the light-reflective substance (e.g., titanium oxide) contained in the light-reflective member 50 is larger than the amount of the light-reflective substance contained in the resin body 30. Specifically, the amount of the light-reflective substance contained in the light-reflective member 50 is preferably at least 1.5 times, more preferably at least twice, and still more preferably at least 2.5 times as great as the amount of the light-reflective substance contained in the resin body 30. For example, in the light-reflective member 50, titanium oxide is contained at 40% by weight with respect to the total amount of the uncured resin material.

In the resin body 30, titanium oxide is contained at 15 to 20% by weight with respect to the total amount of the uncured resin material.

Protective Element 60

The light emitting device 101 may include a protective element 60 in order to improve electrostatic withstand voltage. For the protective element 60, any appropriate protective element mountable on a general light emitting device can be used. For example, a Zener diode may be used for the protective element 60. In the light emitting device 101, the protective element 60 and the light emitting elements 41 and 42 are connected in parallel.

As shown in FIG. 2B, the protective element 60 may be disposed on the upper surface 22a of the second lead 22. The protective element 60 is buried in the light-reflective member 50. Thus, absorption of the light from the light emitting elements 41 and 42 into the protective element 60 can be reduced.

Of two terminals of the protective element 60, one is electrically connected with the upper surface 22a of the second lead 22 by a joining member. Examples of the joining member include a solder such as a tin-bismuth based solder, a tin-copper based solder, a tin-silver based solder, or a gold-tin base solder; a conductive paste or bump made of silver, gold, palladium or the like; or a brazing material such as an anisotropic conductive material and a low melting point metal material. The other terminal of the protective element 60 is connected with the upper surface 21a of the first lead 21 by a wire 61.

Sealing Member

The light emitting device 101 may include a sealing member. The sealing member is disposed in a recess 51, which is defined by the inclined surface 50s of the light-reflective member 50, located in the recess portion 11. The sealing member covers the light emitting elements 41 and 42 at an inner side of the second resin portion 32, which is disposed at a bottom of the recess 51. The sealing member protects the light emitting elements 41 and 42 against an external force, dust, moisture or the like.

The sealing member is formed of a material transmitting preferably 60% or more, more preferably 90% or more, of the light emitted from the light emitting elements 41 and 42. For the sealing member, a resin material usable for the resin body 30 can be used. For a base material of the sealing member, a thermosetting resin, a thermoplastic resin or the like may be used. Examples of the base material include, a silicone resin, an epoxy resin, an acrylic resin, and a resin containing one or more of these. The sealing member may be made of a single layer or may include a plurality of layers. In the sealing member, light scattering particles such as titanium oxide, silicon oxide, zirconium oxide, or aluminum oxide may be dispersed.

The sealing member may contain a material for converting the wavelength of light emitted from the light emitting elements 41 and 42 (e.g., a fluorescent material). More specifically, for the fluorescent material, yttrium aluminum garnet activated by cerium, lutetium aluminum garnet activated by cerium, nitrogen-containing calcium aluminosilicate activated by europium and/or chromium (where a part of calcium may be substituted with strontium), sialon activated by europium, silicate activated by europium, strontium aluminate activated by europium, potassium fluorosilicate activated by manganese, or the like can be used.

The amount of the light scattering particles and/or the fluorescent material may be preferably, for example, about 10 to 100% by weight with respect to the total weight of the sealing member.

Method of producing the light emitting device 101

An embodiment of the method of producing the light emitting device 101 according to the present disclosure will be described. The method of producing the light emitting device 101 according to the present disclosure includes: (A) providing a collective substrate 201, (B) forming the light-reflective member 50, and (C) singulating the collective substrate 201 to provide a plurality of the light emitting devices 101. Hereinafter, each step will be described in detail.

(A) Providing the Collective Substrate 201

Figure 4A:
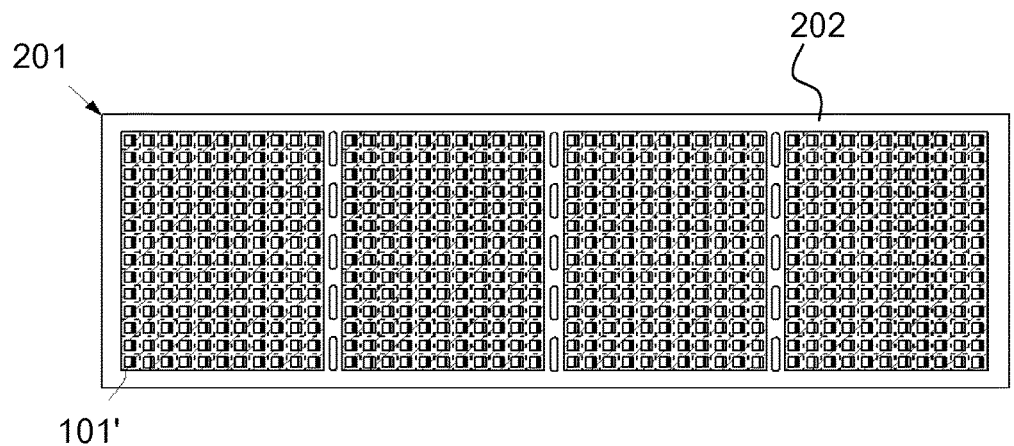
FIG. 4A is a schematic top view of a collective substrate 201.
Figure 4B:
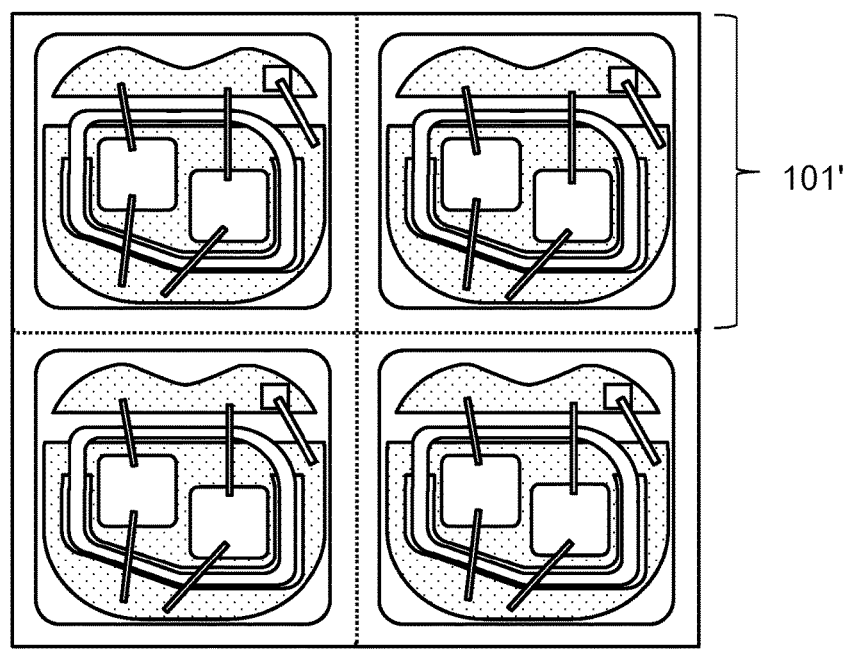
FIG. 4B is a schematic top view of four light emitting device regions 101'.

FIG. 4A is a schematic top view of the collective substrate 201. The collective substrate 201 includes a plurality of portions each of which is to be the light emitting device 101 (hereinafter, such a portion will be referred to as a "light emitting device region 101'"). The light emitting device regions 101' are arranged two-dimensionally. FIG. 4B is a schematic top view of four light emitting device regions 101'. Each of the light emitting device regions 101' has the same structure as that of the light emitting device 101 described above with reference to FIG. 1A through FIG. 3B except that the light emitting device region 101' has not been singulated yet and that the light-reflective member 50 is not disposed.

First, the resin body 30 is formed on a lead frame 202, which includes a plurality of portions to be the first leads 21 (hereinafter, referred to as "first lead regions 21'") and a plurality of portions to be the second leads 22 (hereinafter, referred to as "second lead regions 22'"). FIG. 5 shows, of the lead frame 202 including the plurality of first lead regions 21' and the plurality of second lead regions 22', a portion that corresponds to four light emitting device regions 101'. In the lead frame 202, the first lead regions 21' and the second lead regions 22' are arranged alternately in a y direction. In an x direction, a plurality of the first lead regions 21' or a plurality of the second lead regions 22' are arranged side by side.

In the y direction, the lateral portion 21c of one first lead region 21' and the lateral portion 22d of one second lead region 22' are connected with each other by a coupling portion 24. In the x direction, the lateral portion 21f of one of the first lead regions 21' and the lateral portion 21e of an adjacent one of first lead region 21' are connected with each other via a connecting portion 23.

The resin body 30 may be formed to hold the lead frame 20 by using, for example, a transfer molding method, an injection molding method, a compression molding method or the like.

Figure 6A:
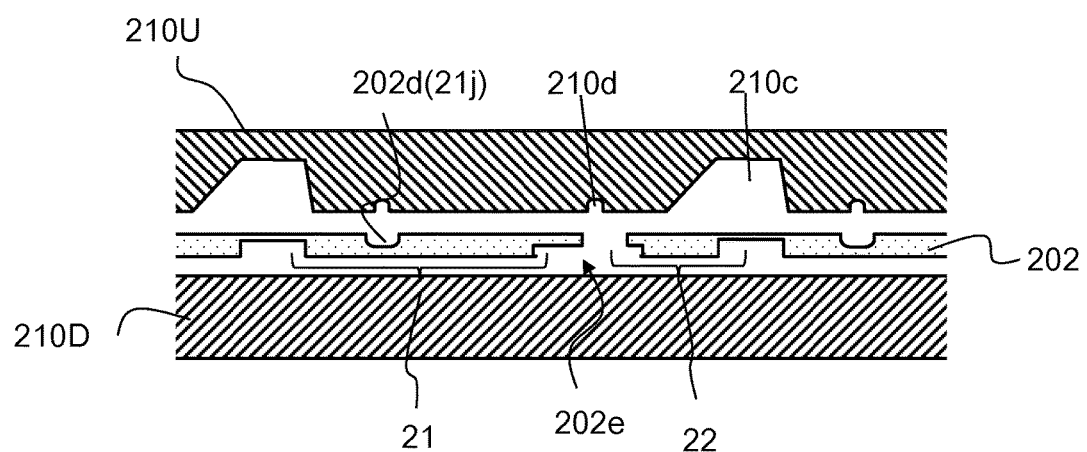
FIG. 6A is a cross-sectional view illustrating a step in a method of producing the light emitting device.

As shown in FIG. 6A, the lead frame 202 is held by molds including an upper mold 210U and a lower mold 210D. The upper mold 210U defines a space 210c, in which the first resin portion 31 is to be formed, and a space 210d, in which the first portion 32c of the second resin portion 32 is to be formed. In this embodiment, the lower mold 210D does not define any space. In a space 202e of the lead frame 202, the third resin portion 33 is to be formed. In a space 202d of the lead frame 202, the second portion 32d of the second resin portion 32 is to be formed. The space 202e of the lead frame 202 is connected with the space 210c in the upper die 210U.

Figure 6B:
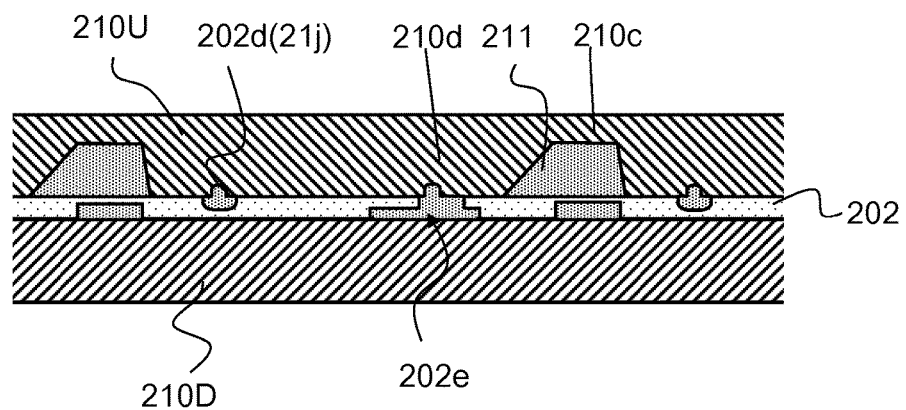
FIG. 6B is a cross-sectional view illustrating a step in the method of producing the light emitting device.

As shown in FIG. 6B, a resin material 211, which is to be the resin body 30, is injected in an uncured state into the above-described spaces between the upper die 210U and the bottom die 210D of the die. Then, the resin material 211 in the molds is heated at a predetermined temperature to perform pre-curing.

Figure 6C:
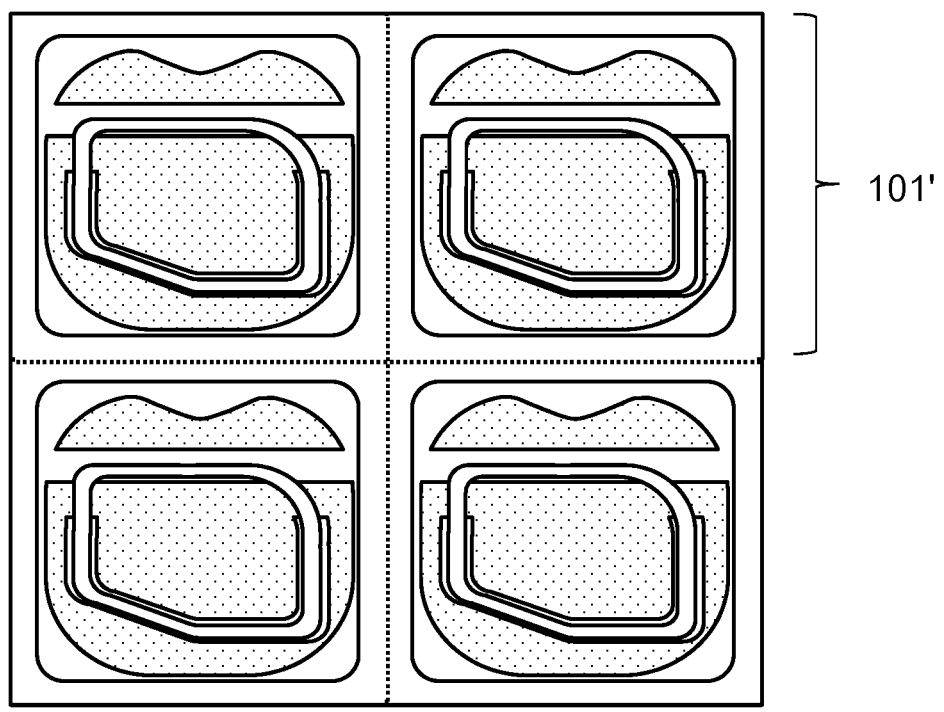
FIG. 6C is a schematic top view of four resin packages.

After this, the resin material 211 subjected to the pre-curing is taken out from the molds, and is heated at a temperature higher than the temperature at which the pre-curing of the resin material 211 is performed to perform curing of resin material 211. Accordingly, the collective substrate 201 including the lead frame 202 and the resin body 30 molded with the lead frame 202 (resin molded body-attached lead frame) is produced. FIG. 6C is a schematic top view of four light emitting device regions 101' that have not been singulated.

The collective substrate 201 may be provided by manufacturing through the above-described method. Alternatively, the collective substrate 201 may be provided by, for example, purchasing a collective substrate that have been manufactured. A plurality of the resin packages 10 may be integrally molded, or individually molded. The present invention is not limited to the case of using a collective substrate 201 including the plurality of resin packages 10, and for example, a single resin package 10 may be provided and used.

The light emitting elements 41 and 42 are disposed at the bottom 11b of the recess 11 in each light emitting device region 101'. In the present embodiment, the light emitting elements 41 and 42 are bonded onto the first lead region 101' by a joining member made of, for example, a resin material described above. Further, the wires 43a, 43b, 43c and 43d for electrically connecting the light emitting elements 41 and 42 with the first lead region 21' and the second lead region 22' are formed. In the case where the light emitting device 101 includes the protective element 60, the protective element 60 is located in the recessed 11 at this time.

(B) Forming the Light-Reflective Member 50

Figure 7:
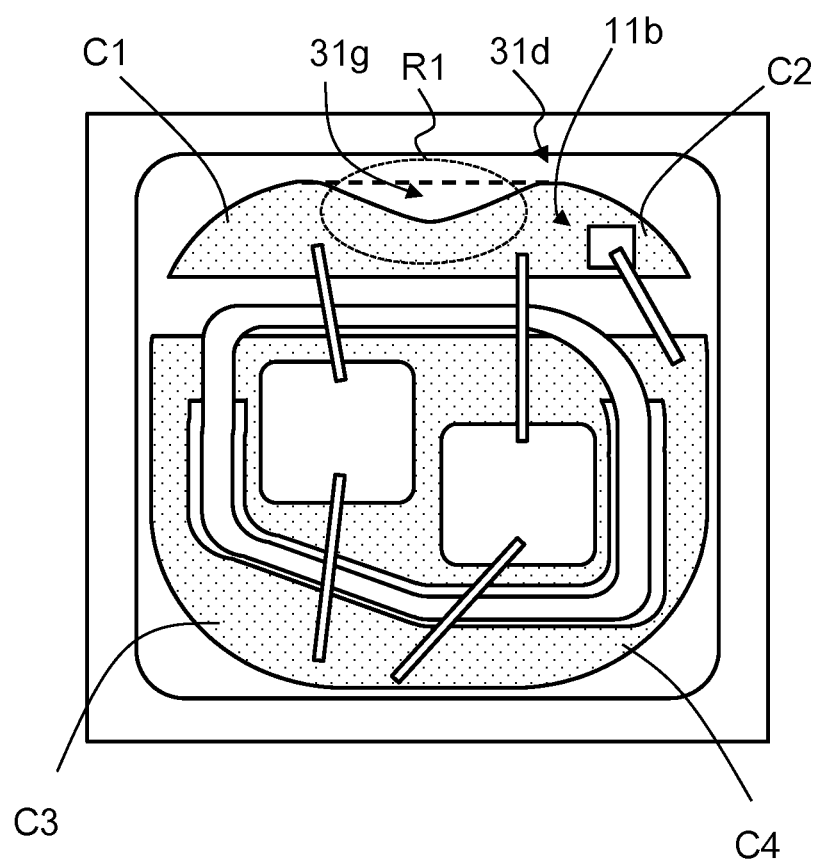
FIG. 7 is a schematic top view showing a position at which an uncured resin material for a light-reflective member is to be injected.

The light-reflective member 50 is formed in the recess 11 of the light emitting device region 101'. More specifically, a resin material for the light-reflective member 50 in an uncured state is disposed on the bottom 11b of the recess 11 of the light emitting device region 101'. The light-reflective member 50 may be formed by using a potting technique. In this case, for example, the uncured resin material for the light-reflective member 50 is injected from above to the bottom 11b of the recess of the light emitting device region 101' in a region between the inner lateral wall surface 31c, 31d, 31e or 31f and the second resin portion 32, except for a region where the distance between the inner lateral wall surface 31c, 31d, 31e or 31f and the second resin portion 32 is shortest. In the present embodiment, as shown in FIG. 7, of four corner regions C1, C2, C3 and C4 of the bottom 11b, in the region C4, the distance between a connection portion of the inner lateral wall surface 31c and the inner lateral wall surface 31f, and the second resin portion 32, is shortest. In view of this, the uncured resin material for the light-reflective member 50 is injected from above to a region other than the corner region C4. For example, the resin material is injected to at least one of the corner regions C1, C2 and C3 from thereabove.

In the case where the resin material is applied (deposited) to one region by potting, if the region to which the resin material is injected has a small area, the injected resin material may overflow from the region. In this embodiment, the uncured resin material for the light-reflective member 50 is injected to a region except for the corner region C4, in which the distance between each of the inner lateral wall surface 31c, 31d, 31e or 31f, and the second resin portion 32, is shortest. The "distance between each of the inner lateral wall surface 31c, 31d, 31e and 31f, and a corresponding portion of the second resin portion 32" refers to the shortest distance on the bottom 11b between any point on an outer perimeter of each of the inner lateral wall surfaces 31c, 31d, 31e, and 31f and a corresponding portion of the second resin portion 32. In the corner regions C1, C2 and C3, the distance between the inner lateral wall surface 31c, 31d, 31e or 31f, and the second resin portion 32, is longer than that in the corner region C4. Therefore, it is preferable to inject the uncured resin material for the light-reflective member 50 to such a corner region. With this manner, the resin material can be inhibited from overflowing from a region where the resin material is disposed; for example, the resin material can be inhibited from being disposed beyond the second resin portion 32 to the element mounting region 21r.

In the case where a potting technique is used, the resin material, after being applied, moves due to natural flowing. Therefore, in the case where the resin material moves at a great distance and the region to which the resin material moves has a large area, the injected resin material may not spread sufficiently in the region, which may allow the resin material to be insufficiently filled.

In the present embodiment, region R1 between a center or its vicinity of the inner lateral wall surface 31d and the second resin portion 32 has a long distance from both of the corner regions C1 and C2. However, with the inner lateral wall surface 31d having the protruding portion 31g which is located at a center or in the vicinity of the center of the inner lateral wall surface 31d, the distance between the protruding portion 31g in the inner lateral wall surface 31d and the second resin portion 32 is reduced. That is, an area of the region R1 is smaller than that in the case where the protruding portion 31g is not provided (i.e., in the case where the inner lateral wall surface 31d has a shape as indicated by the dashed line). Therefore, for example, in the case where the uncured resin material for the light-reflective member 50 is injected to the corner regions C1 and C2 close to the protruding portion 31g, region R1 can be easily filled with the uncured resin material for the light-reflective member 50 without insufficiency.

The uncured resin material for the light-reflective member 50 is injected from above the bottom 11b of the recess 11 and is allowed to naturally flow on the bottom 11b. This allows the region between the inner lateral wall surfaces 31c, 31d, 31e and 31f, and the second resin portion 32, to be filled with the resin material without great insufficiency in filling. With the second resin portion 32, the uncured resin material for the light-reflective member 50 can be inhibited from reaching the element mounting region 21r and thus covering lateral surfaces of the light emitting elements 41 and 42.

Figure 8:
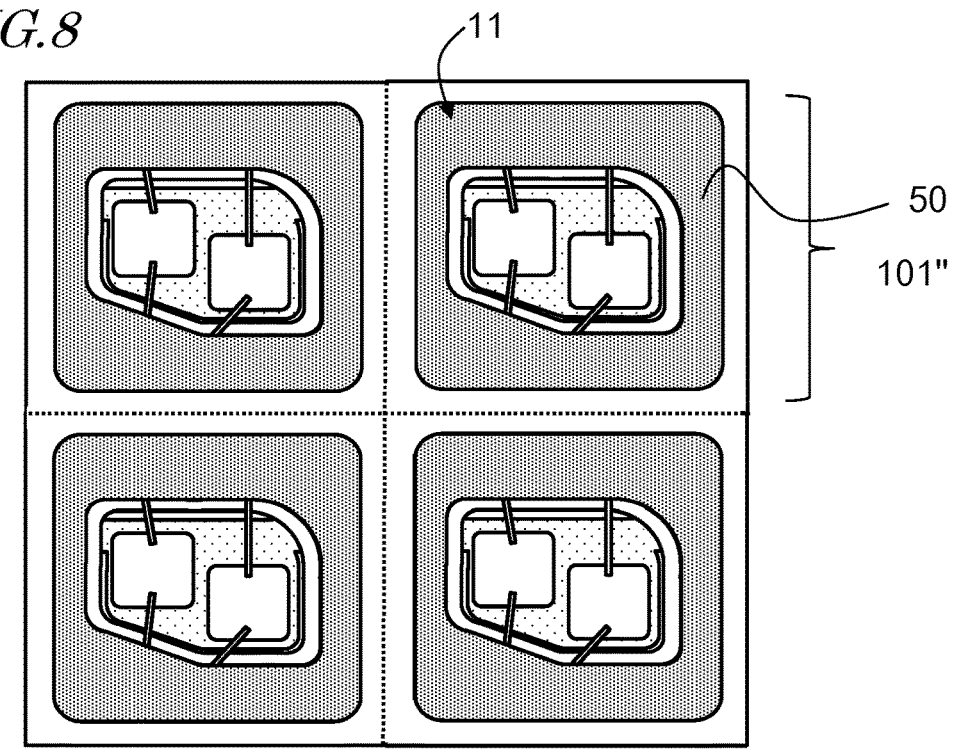
FIG. 8 is a schematic top view of four light emitting devices 101" in a non-separated state.

Then, the uncured resin material for the light-reflective member 50 is cured (i.e., solidified) by heat, light or the like. As a result, as shown in FIG. 8, the light-reflective member 50 is formed in the recess 11.

Thus, light emitting devices 101" in a state of having not been singulated are formed.

Figure 9:
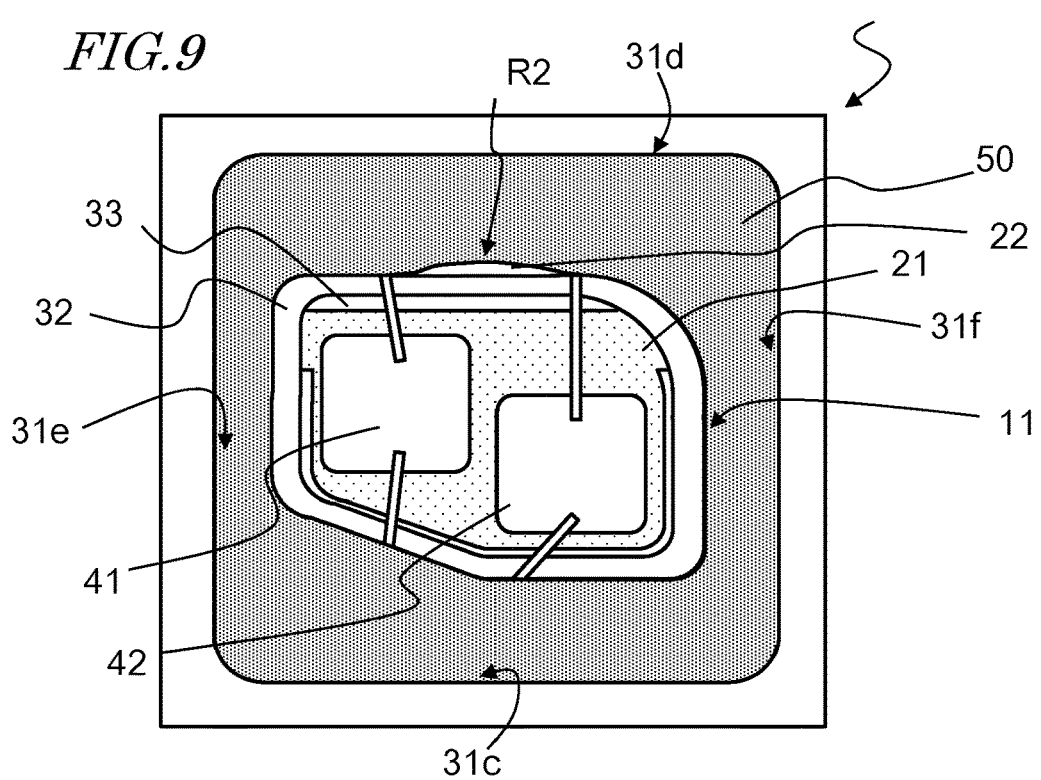
FIG. 9 is a schematic top view of another light emitting device.

In each of the light emitting devices 101" that have not been singulated, it is preferable that the light-reflective member 50 is formed in the entirety of the region between the inner lateral wall surfaces 31c, 31d, 31e and 31f of the recess 11 and the second resin portion 32. Meanwhile, as shown in FIG. 9, 10% or less, preferably 5% or less, of the region between the inner lateral wall surfaces 31c, 31d, 31e and 31f of the recess 11 and the second resin portion 32 may be exposed from the light-reflective member 50. Alternatively, in a region R2, which is close to the second resin portion 32 and is not directly irradiated with the light from the light emitting elements 41 and 42, for example, a part of the upper surface of the first and/or the second lead 21, 22 or a part of the third resin portion 33 may be exposed from the light-reflective member 50.

(C) Singulating the Collective Substrate 201 to Provide a Plurality of the Light Emitting Devices 101

The collective substrate 201 is singulated to provide a plurality of the light emitting devices 101.

Examples of a method of singulating the collective substrate 201 includes various methods such as using a lead-cutting mold, cutting with a dicing saw, and cutting with laser light. At the time of singulating the collective substrate 201, in the case where, for example, a plurality of resin packages are integrally molded, the first and second leads and the resin body are cut at the same time to singulate. In the case where the resin packages are individually molded, the collective substrate 201 can be singulated by cutting only the first and second leads.

Figure 10A:
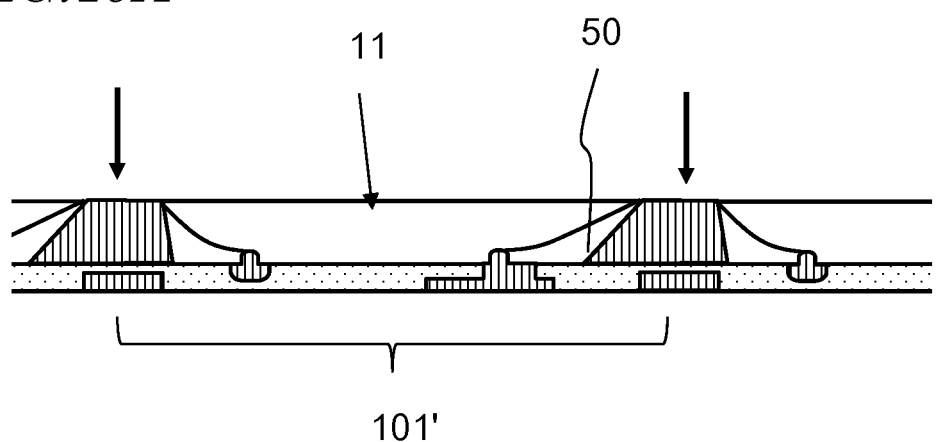
FIG. 10A is a cross-sectional view showing a step in a method of producing the emitting device.
Figure 10B:
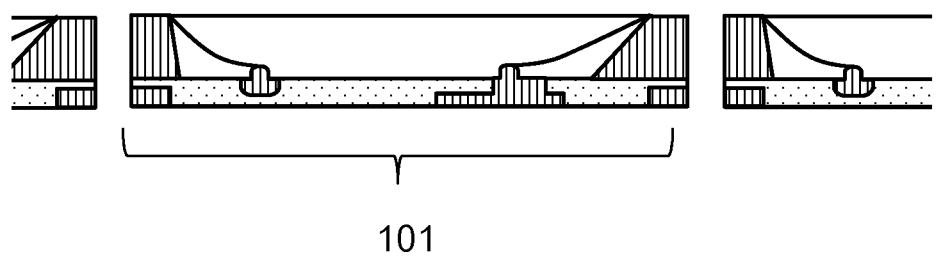
FIG. 10B is a cross-sectional view showing a step in the method of producing the light emitting device.

As shown in FIG. 10A, the collective substrate 201, which includes a plurality of the light emitting device regions 101' each including the light-reflective member 50 in the recess 11, is cut at predetermined positions indicated by arrows. As a result, as shown in FIG. 10B, the plurality of light emitting devices 101 are provided.

Effects

In the light emitting device 101, at least one of the inner lateral wall surfaces 31c, 31d, 31e and 31f defining the recess 11 has the at least one protruding portion 31g. Accordingly, a distance between at least one of the inner lateral wall surface 31c, 31d, 31e and 31f, which has the at least one protruding portion, and a corresponding portion of the second resin portion 32 can be reduced.

Thus, at the time of filling such a region with the resin material for the light-reflective member 50, the region can be inhibited from insufficiently charging the resin material. Therefore, the light-reflective member 50 can be disposed at an appropriate position, and thus the light emitting device 101 having a high light extraction efficiency can be realized. In the case of mounting the light emitting elements 41 and 42 on the first lead 21, with the protruding portion 31g located above the second lead 22, insufficiency of the light-reflective member 50 can be inhibited.

Other Embodiments

Figure 11A:
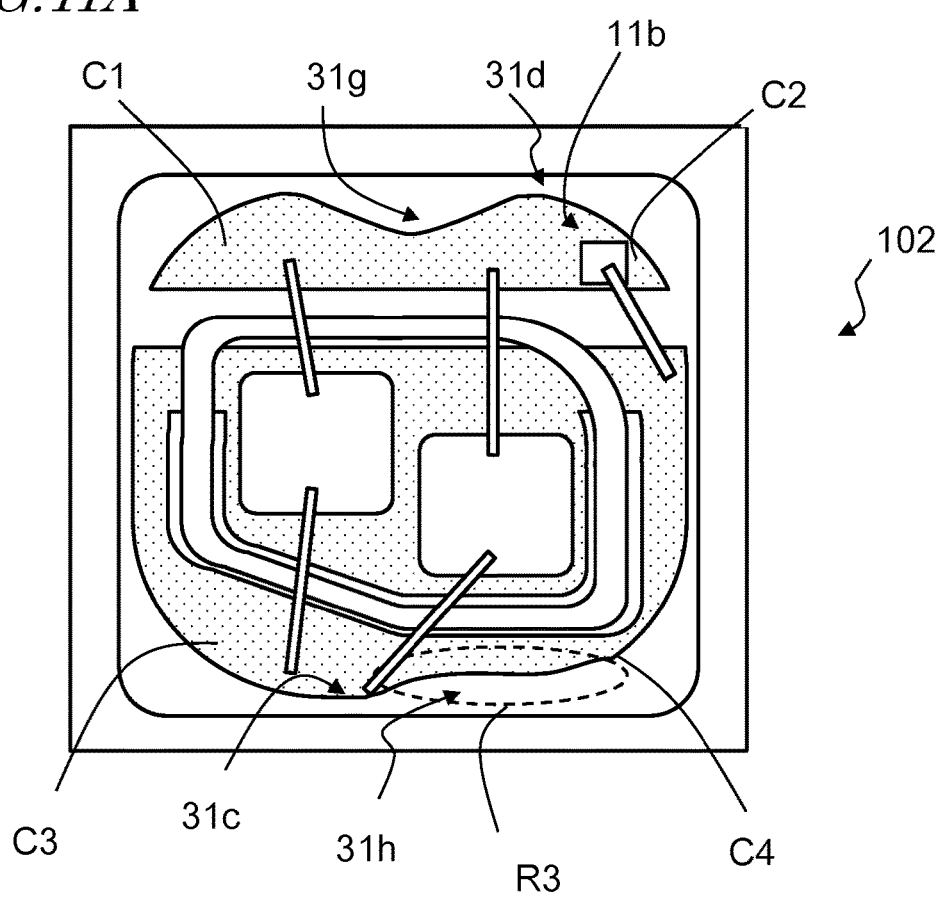
FIG. 11A is a schematic top view of a light emitting device in another embodiment.
Figure 11B:
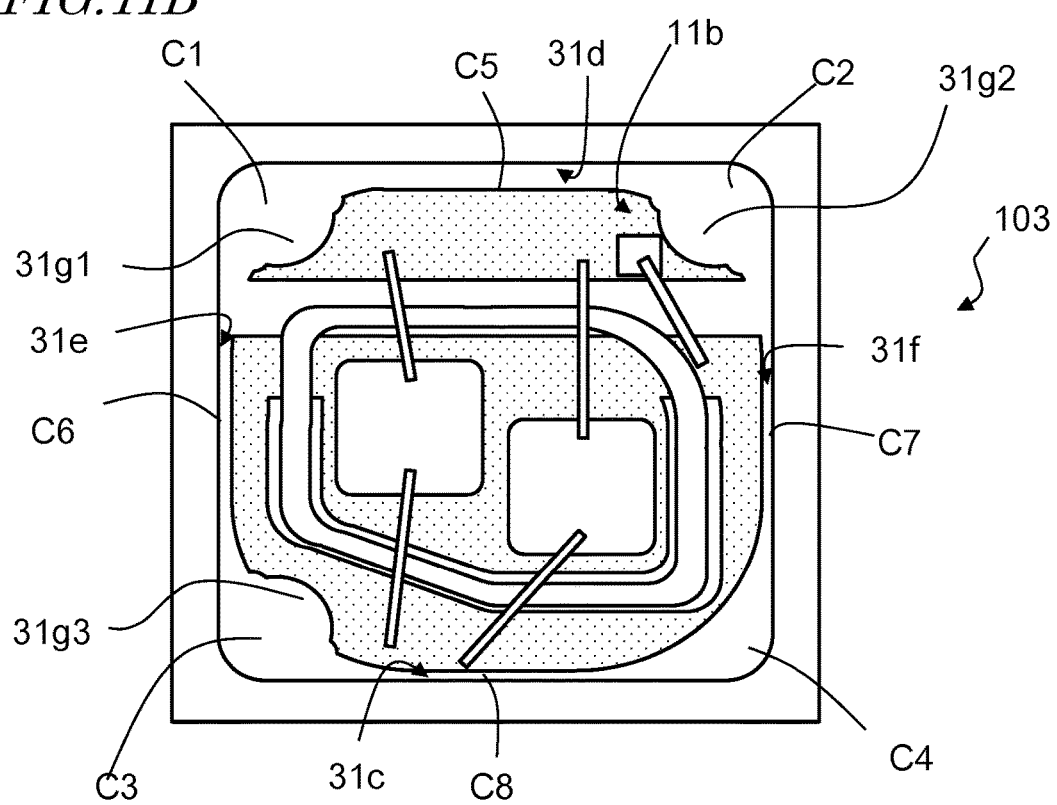
FIG. 11B is a schematic top view of a light emitting device in still another embodiment.

The light emitting device 101 may be varied in various forms. In particular, the position or the number of the protruding portions included in at least one of the inner lateral wall surfaces 31c, 31d, 31e and 31f may be varied. Because the at least one protruding portion is covered with the light-reflective member 50, each of FIG. 11A and FIG. 11B show a top view of a light emitting device in a state where the light-reflective member 50 is removed.

In the light emitting device according to the present disclosure, two or more protruding portions may be disposed. In a light emitting device 102 shown in FIG. 11A, the inner lateral wall surfaces 31c and 31d has protruding portions 31h and 31g, respectively. In the light emitting device 102 shown in FIG. 11A, in a top view, region R3 between a central portion of the inner lateral wall surface 31c to the corner region C4 is far from the corner region C3. Therefore, at the time of injecting the uncured resin material for the light-reflective member 50 to the corner regions C1, C2 and C3, the uncured resin material may not easily spread in region R3. In view of this, with the protruding portion 31h, the light-reflective member 50 can be inhibited from being insufficiently charged in region R3.

The position of the protruding portion in the inner lateral wall surface 31c, 31d, 31e or 31f is related to the position at which the uncured resin material for the light-reflective member 50 is to be injected. In the case where, as shown in FIG. 11B, the uncured resin material for the light-reflective member 50 is injected to, for example, central positions C5, C6, C7 and C8 of the inner lateral wall surfaces 31d, 31e, 31f and 31c from thereabove, regions close to the corner regions C1, C2, C3 and C4 are farthest from the positions C5, C6, C7 and C8. In a light emitting device 103 shown in FIG. 11B, protruding portions 31g1, 31g2 and 31g3 are located at the corner regions C1, C2 and C3, respectively, each of which is a portion connecting respective ones of the inner lateral wall surfaces 31c, 31d, 31e and 31f, that is, located at regions close to three of the four corners of the bottom 11b. In the light emitting device 103, with such a structure, at the time of injecting the uncured resin material for the light-reflective member 50 to the central positions C5, C6, C7 and C8 of the inner lateral wall surfaces 31d, 31e, 31f and 31c in a top view, respectively, the light-reflective member 50 can be inhibited from being sufficiently charged in the corner regions C1, C2 and C3. In FIG. 11B, the light emitting device 103 includes the protruding portions 31g1, 31g2 and 31g3. Alternatively, one or two protruding portions may located in one or more regions, of the corner regions C1, C2, C3 and C4, where the light-reflective member 50 tends to be insufficiently charged.

In the light emitting device according to the present disclosure, it is preferable that the protruding portion 31g, disposed in at least one of the inner lateral wall surface 31c, 31d, 31e or 31f, has a curved line continuous with a corresponding one of the inner lateral wall surface 31c, 31d, 31e and 31f. Alternatively, the protruding portion 31g may have a shape of, for example, a triangular pyramid, a polygonal pyramid or the like with clear ridges. In this case, it is preferable that the connection portion between the protruding portion 31g and a corresponding one of the inner lateral wall surface 31c, 31d, 31e and 31f is curved. This is because, if the protruding portion 31g and a corresponding one of the inner lateral wall surface 31c, 31d, 31e and 31f are connected to form a distinct corner, air bubbles are likely to be formed at the corner, which may easily lead to insufficiency in charging of the resin material.

While exemplary embodiments of the present invention have been described, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A light emitting device comprising:
    a resin package comprising:
        a plurality of leads, including:
            a first lead having an upper surface and a lower surface, and
            a second lead having an upper surface and a lower surface; and
        a resin body;
        the resin package having a recess defined by at least the upper surfaces of the plurality of leads and one or more inner lateral wall surfaces of the resin body; and
    a pair of light emitting elements disposed at a bottom of the recess,
    wherein at least one of the one or more inner lateral wall surfaces of the resin body has a protruding portion that protrudes toward an inside of the recess,
    wherein in a top plan view, the protruding portion is on a straight line that is located between the pair of light emitting elements,
    wherein the first lead comprises:
        an upper surface groove that extends downward into the upper surface of the first lead, and
        a lateral peripheral groove that extends upward into the lower surface of the first lead along a lateral side of the first lead,
    wherein, in the top view, the upper surface groove does not overlap the lateral peripheral groove.

2. The light emitting device according to claim 1, wherein the one or more inner lateral wall surfaces include four inner lateral wall surfaces, and the protruding portion is located in a vicinity of a central portion of one of the four inner lateral wall surfaces in the top view.

3. The light emitting device according to claim 1, wherein the plurality of leads includes a third lead.

4. The light emitting device according to claim 1, wherein the inner bottom of the recess has an element mounting region in which the pair of light emitting elements are disposed, the groove is disposed along at least a portion of an outer perimeter of the element mounting region.

5. The light emitting device according to claim 1, wherein the resin body includes a portion that is disposed in the groove.

6. The light emitting device according to claim 1, wherein:
    the resin package has an upper surface;
    the recess has an opening in the upper surface of the resin package;
    each of the opening and the bottom of the recess has an approximately quadrangular shape, and four corners of an outer perimeter of the bottom are rounded to form an arc shape having a radius greater than that of the four corners of the outer perimeter of the opening.

7. The light emitting device according to claim 1, further comprising a protective element.

* * * * *